United States Patent [19]
Murata

[11] Patent Number: 5,396,190
[45] Date of Patent: Mar. 7, 1995

[54] CIRCUIT FOR COMPENSATING FOR NONLINEAR DISTORTION IN TRANSMIT POWER AMPLIFIER

[75] Inventor: Takashi Murata, Amagasaki, Japan

[73] Assignee: Mitsubishi Denki Kabushiki Kaisha, Tokyo, Japan

[21] Appl. No.: 220,165

[22] Filed: Mar. 30, 1994

[30] Foreign Application Priority Data

Apr. 20, 1993 [JP] Japan .................. 5-093133

[51] Int. Cl.$^6$ .............................. H03F 1/26
[52] U.S. Cl. .................. 330/149; 332/103; 325/296; 455/63; 327/317
[58] Field of Search .......... 330/149; 328/162; 332/103, 159, 162; 375/60; 455/50.1, 63

[56] References Cited

U.S. PATENT DOCUMENTS 4,700,151 10/1987 Nagata .................. 330/149 X

FOREIGN PATENT DOCUMENTS 61-214843 9/1986 Japan .
530147 2/1993 Japan .

*Primary Examiner*—James B. Mullins
*Attorney, Agent, or Firm*—Rothwell, Figg, Ernst & Kurz

[57] ABSTRACT

A distortion compensating unit is provided which can reduce the time required to converge distortion compensation values into a given value and operate with an improved stability after said convergence. Constants of multipliers in a correcting factor generating circuit are switched from one to another, depending on the time from the start of operation of a distortion compensating circuit or the temperature in a power amplifier. A constant to be switched is selected to be larger than that of the prior art until the convergence is completed and to be smaller than that of the prior art after the convergence has been completed. Thus, the time required to converge the corrected value into a given value can be reduced to less than that of the prior art. In addition, the distortion compensating unit can operate with an improved stability after the convergence.

9 Claims, 3 Drawing Sheets

CIRCUIT FOR COMPENSATING FOR NONLINEAR DISTORTION IN TRANSMIT POWER AMPLIFIER

BACKGROUND OF THE INVENTION

1. Field of the Invention

The present invention relates to a circuit for compensating for the nonlinear distortion of a transmit power amplifier in a digital DC/AC modulating system.

2. Description of the Related Art

In the accompanying drawings, FIG. 3 Shows a distortion compensating unit as described in Japanese Patent Laid-Open No. Sho 61-214843. The distortion compensating unit comprises an input terminal 1 for receiving a sequence of transmit bits 10, a clock terminal 3 for receiving sample clocks 21, a mapping circuit 100 for generating symbol codes 20a and 20b from the sequence of transmit bits 10, a wave-form shaping filter 200 including a read-only memory used to generate sampled values 30a and 30b from the symbol codes 20a and 20b, a power amplifier 400, a distortion compensating circuit 300 for compensating for a distortion produced when the power amplifier 400 operates, a coupler 401 for taking out part of the output of the power amplifier 400 and an attenuator 402 for attenuating the signal taken out by the coupler 401.

The waveform shaping filter 200 comprises a frequency divider 210 for dividing sample clocks 21 by $2^N$ (where N is an integer) to form symbol clocks 22, a $2^N$ counter 211 for performing the counting operation on the sample clocks 21, a shift register 212 responsive to the symbol clocks 22, and a read-only memory 213 being addressed by the counts of the counter 211 and the contents of the shift register 212 to output the sampled values 30a and 30b therefrom.

The distortion compensating circuit 300 comprises a rewritable memory 310 for receiving read addresses from the sampled values 30a and 30b and for outputting a distortion compensation value used to compensate for a distortion produced when the power amplifier operates, an adder for adding the distortion compensation value from the memory 310 to the sampled values 30a and 30b, a digital/analog (D/A) converter 312 for converting a digital value from the adder 311 into an analog value, an oscillator 313 for generating carrier waves, a quadrature modulator 314 for modulating the carrier waves from the oscillator 313 by the output of the D/A converter 312, a quadrature demodulator 315 for demodulating part of the output taken from the power amplifier 400 by the coupler 401, an analog/digital (A/D) converter 316 for converting the analog output of the quadrature demodulator 315 into a digital value, a subtractor 317 for subtracting the digital output of the A/D converter 316 from the sampled values 30a and 30b, a correction factor generator 318 for computing a correction factor for the contents of the rewritable memory 310 from the output of the subtractor. 317, and a computing circuit 319 for performing the addition or subtraction between the outputs of the correction factor generator 318 and rewritable memory 310 and for suitably rewriting the contents of the rewritable memory 310 by the use of a value resulting from said addition or subtraction.

On operation, sampling clocks 21 inputted through the clock terminal 3 are $2^N$ divided by the divider 210 into symbol clocks 22 which in turn drive the shift register 212 to shift the symbol codes 20a and 20b from the mapping circuit 100. In such a manner, the sampled values 30a and 30b will be read out from the read-only memory 213.

The operation of the distortion compensating circuit 300 will now be described.

For each sampled value, part of the output of the power amplifier 400 is taken out and demodulated to take a difference between the demodulated value and that sampled value, which difference is used to detect a distortion produced by the power amplifier 400. On detection, the distortion is stored in the memory 310 corresponding to the transmitted sampled value. When the same sampled value again appears on the base band signal 31a and 31b, the distortion produced by the power amplifier 400 can be negated by the distortion compensating circuit 300 if a distortion equivalent to that produced by the power amplifier 400 has already been applied to the sampled value. This can be accomplished by reading the distortion value corresponding to that sampled value which has been stored in the memory 310 and adding the distortion value to the sampled value.

In the distortion compensating unit shown in FIG. 3, the rewritable memory 310 has previously stored distortion components to be added to the sampled values 30a and 30b to compensate for the distortion produced by the nonlinearity in the power amplifier 400. First of all, distortion compensating factors corresponding to the sampled values 30a and 30b are read out from the rewritable memory 310 using these sampled values 30a and 30b as addresses. The first adder 311 adds the sampled values 30a and 30b to the output of the rewritable memory 310 to obtain base band signals 31a and 31b compensated in distortion. These base band signals 31a and 31b are then converted into analog signals by the D/A converter 312. The quadrature modulator 314 uses the analog signals to modulate the carrier waves 313. The modulated carrier waves 313 are amplified by the power amplifier 400, the output of which is partially taken out by the coupler 401. The taken-out signals are attenuated to an appropriate level by the attenuator 402 and then demodulated into base band signals by the quadrature demodulator 315. These base band signals are converted into digital values by the A/D converter 316. The subtractor 317 subtracts the digital values from the sampled values 30a and 30b which should correctly be transmitted. If the rewritable memory 310 has outputted a distortion compensation factor sufficient to negate the nonlinear distortion in the power amplifier 400, the output of the subtractor 317 will be zero. The correction factor generator 318 increases the output of the subtractor 317 by $\alpha$ times ($0 < \alpha \leq 1$), which is in turn added to the output of the rewritable memory 310 at the computing circuit 319. The resulting value is again written into the memory. In such a manner, the distortion to be compensated for will suitably be controlled and rewritten in the rewritable memory 310.

Since the distortion compensation values have been written in the memory at the storage areas corresponding to the base band data in the distortion compensating unit of the prior art as described, it is required to rewrite all the data in the memory to converge the distortion compensation value into an appropriate value. Therefore, the proper distortion compensation requires a given time period.

SUMMARY OF THE INVENTION

In order to overcome the above problem, an object of the present invention is to reduce the time required to complete the distortion compensation to less than the prior art and also to improve the stability in the distortion compensating circuit.

To this end, the present invention provides a distortion compensating unit comprising distortion pre-compensating means having a memory for receiving a base band signal and memory read signal to record and update data used to compensate for the nonlinearity of an amplifier, the distortion pre-compensating means operable to pre-distort the nonlinearity of said amplifier in the opposite direction so that a distortion produced in said amplifier will be offset by said pre-distortion, a modulator responsive to the output of the distortion pre-compensating means to provide a modulated signal to said amplifier, a demodulator for taking out and demodulating part of the output of said amplifier, comparator means for comparing the output of said demodulator with said base band signal, and a correction factor generating circuit for computing a plurality of corrective coefficients on the contents of said memory from the output of said comparator means by switching said corrective coefficients, the corrected contents of said memory being then provided to said distortion pre-compensating means.

The present invention also provides a distortion compensating unit comprising distortion pre-compensating means having a memory for receiving a base band signal and memory read signal to record and update data used to compensate for the nonlinearity of an amplifier, the distortion pre-compensating means operable to pre-distort the nonlinearity of said amplifier in the opposite direction so that a distortion produced in said amplifier will be offset by said predistortion, a modulator responsive to the output of the distortion pre-compensating means to provide a modulated signal to said amplifier, a demodulator for taking out and demodulating part of the output of said amplifier, comparator means for comparing the output of said demodulator with said base band signal, and a correction factor generating circuit for computing a plurality of corrective coefficients on the contents of said memory from the output of said comparator means by switching said corrective coefficients depending on the temperature of said amplifier, the corrected contents of said memory being then provided to said distortion pre-compensating means.

Since the correction factor generator in the distortion compensating unit according to the present invention calculates a plurality of corrective coefficients by switching them and outputs the corrected contents of said memory to said distortion pre-compensating means, the distortion compensating unit can operate more stably with an increased convergence and with a reduced constant.

Since the correction factor generator in the distortion compensating unit according to the present invention calculates a plurality of corrective coefficients by switching them depending on the temperature of the amplifier and outputs the corrected contents of said memory to said distortion pre-compensating means, the distortion compensating unit can operate more stably with an increased convergence and with a reduced constant.

DETAILED DESCRIPTION OF THE PREFERRED EMBODIMENTS

First Embodiment

Figure 1:
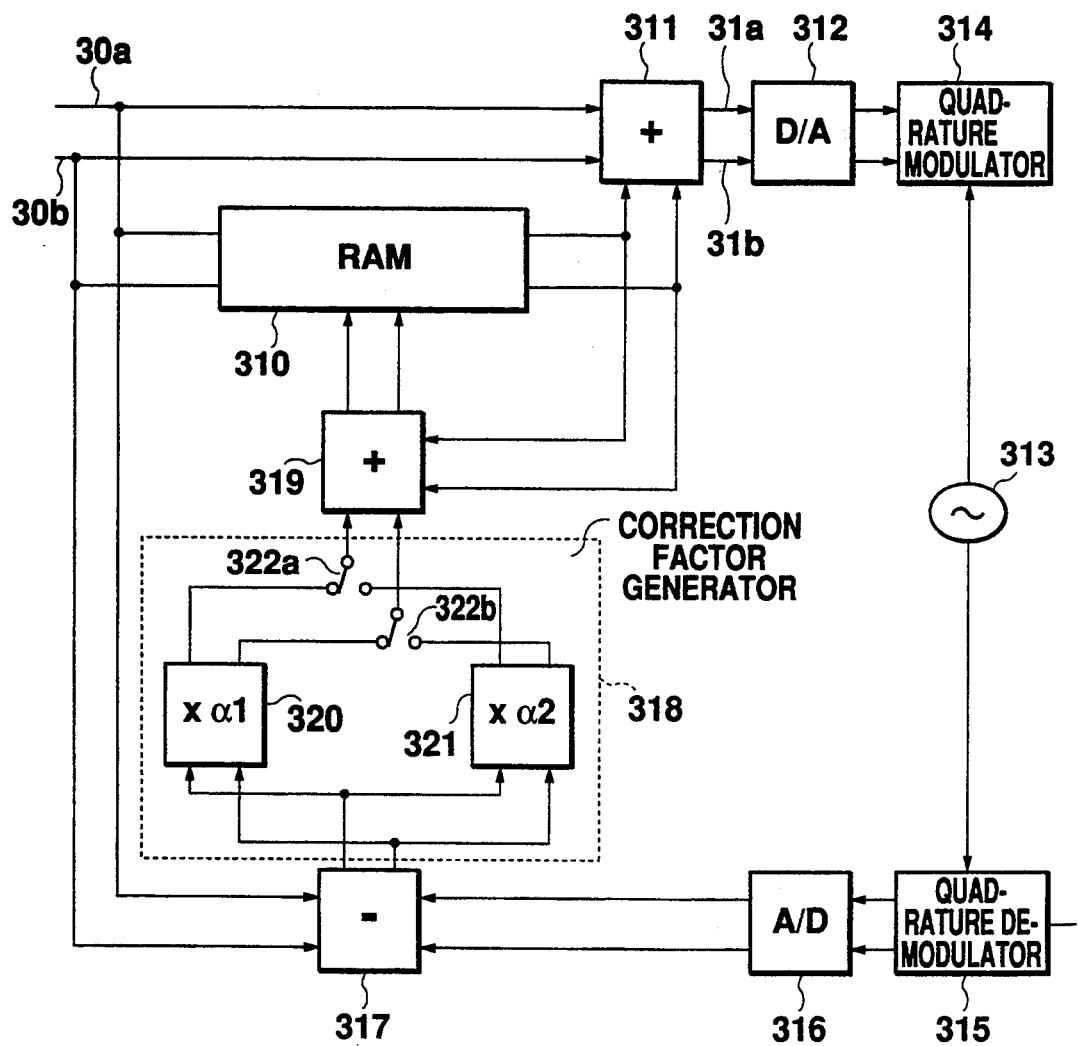
FIG. 1 is a block diagram of one embodiment of a distortion compensating unit constructed in accordance with the present invention.

Referring to FIG. 1, there is shown a distortion compensating circuit in a distortion compensating unit constructed according to the present invention. The distortion compensating circuit comprises a memory 310 for storing distortion compensation values and an adder 311 for adding sampled values 30a and 30b being base band signals to the distortion compensation values to provide base band signals 31a and 31b pre-compensated in distortion. The memory 310 and adder 311 define a distortion pre-compensating means. The distortion compensating circuit also comprises a digital/analog (D/A) converter 312, an analog/digital (A/D) converter 316, and a subtractor 317 for computing a difference between the sampled values 30a, 30b and the output of the A/D converter 316. Since the A/D converter 316 converts base band signals taken out from part of the output of the power amplifier and then demodulated into digital signals, the output of the subtractor 317, which defines a comparator means, can be said to be just the nonlinear distortion in the power amplifier. The distortion compensating circuit further comprises a correction factor generating circuit 318, a multiplier 320 functioning as a first computing means having a first constant $\alpha 1$, another multiplier 321 functioning as a second computing means having a second constant $\alpha 2$, switch means 322a and 322b for switching the outputs of the multipliers, and an adder for computing an error between the present and previous correction factors.

For time t from the start of the distortion compensating circuit, the multiplier selecting switches 322a and 322b in the correcting factor generating circuit 318 selects the constant $\alpha 1$ side multiplier 320. The subtractor 317 computes a difference between the sampled values 30a, 30b and a signal added by the nonlinear distortion of the power amplifier. The output of the subtractor 317 is multiplied by the constant $\alpha 1$ at the multiplier 320. The multiplied data is then computed with the previous data written in the rewritable memory 310 and again written in the same memory at the same address. Thus, the data is updated. After passage of the time t from the start of operation of the distortion compensating circuit, the multiplier selecting switches 322a and 322b operate to select the constant $\alpha 2$ side multiplier 321.

Where the constant in the multiplier of the prior art is assumed to be $\alpha$, there is the following relationship between the constant $\alpha$ and the constants $\alpha 1$, $\alpha 2$:

$$0 < \alpha 2 < \alpha < \alpha 1 \leq 1$$

It can be understood from the above relationship that for time t after the start of operation of the distortion compensating circuit, the constant to multiply the nonlinear distortion produced in the power amplifier is larger than that of the prior art ($\alpha < \alpha 1$). As a result, the time required to converge the data stored in the rewritable memory 310 into a given value can be reduced to less than that of the prior art. After passage of time t from the start of operation of the distortion compensating circuit, the constant to multiply the nonlinear distortion becomes smaller than that of the prior art ($\alpha 2 < \alpha$). As a result, it becomes unlikely that the data stored in the memory 310 will be out of the given value.

Second Embodiment

In the first embodiment, the multiplier selecting switches 322a and 322b are actuated to select one of the multipliers within a time from the start of the distortion compensating unit. The multiplier selecting switches may be controlled by the temperature of the power amplifier which affects the nonlinear distortion in the power amplifier.

Figure 2:
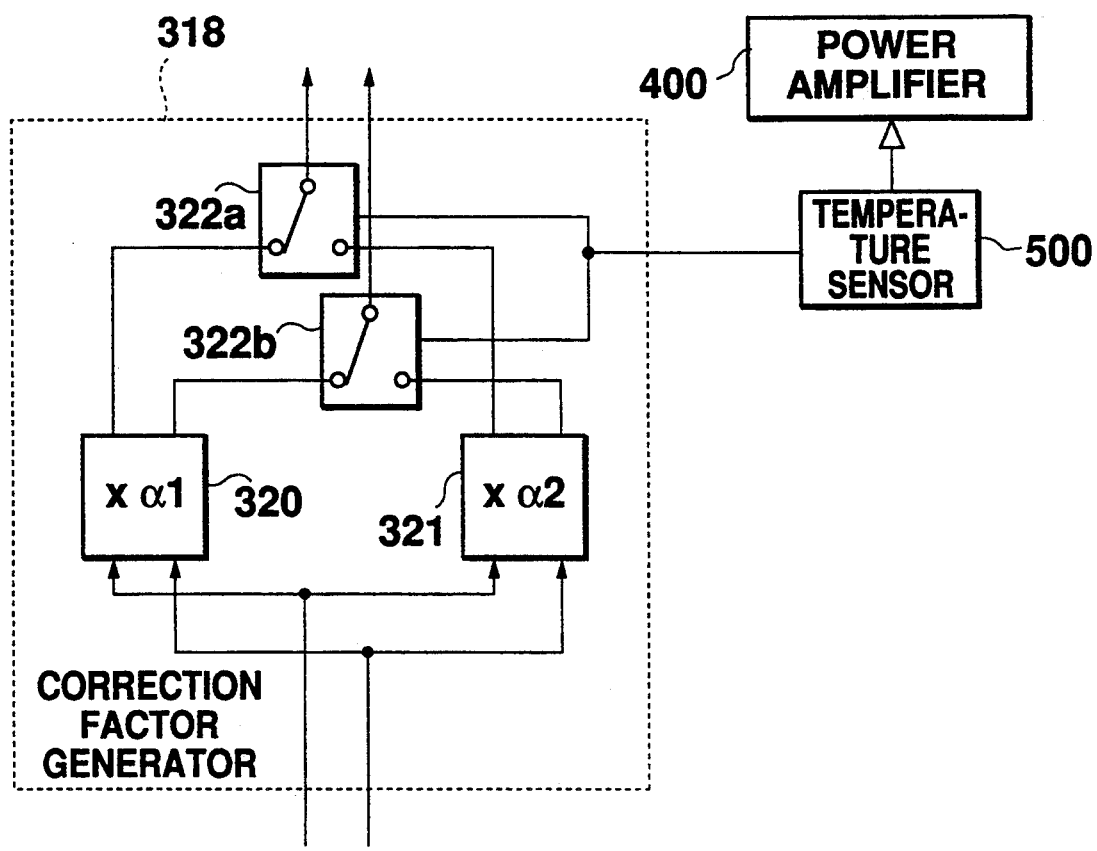
FIG. 2 is a block diagram of another embodiment of a distortion compensating unit constructed in accordance with the present invention, showing the primary parts thereof.
Figure 3:
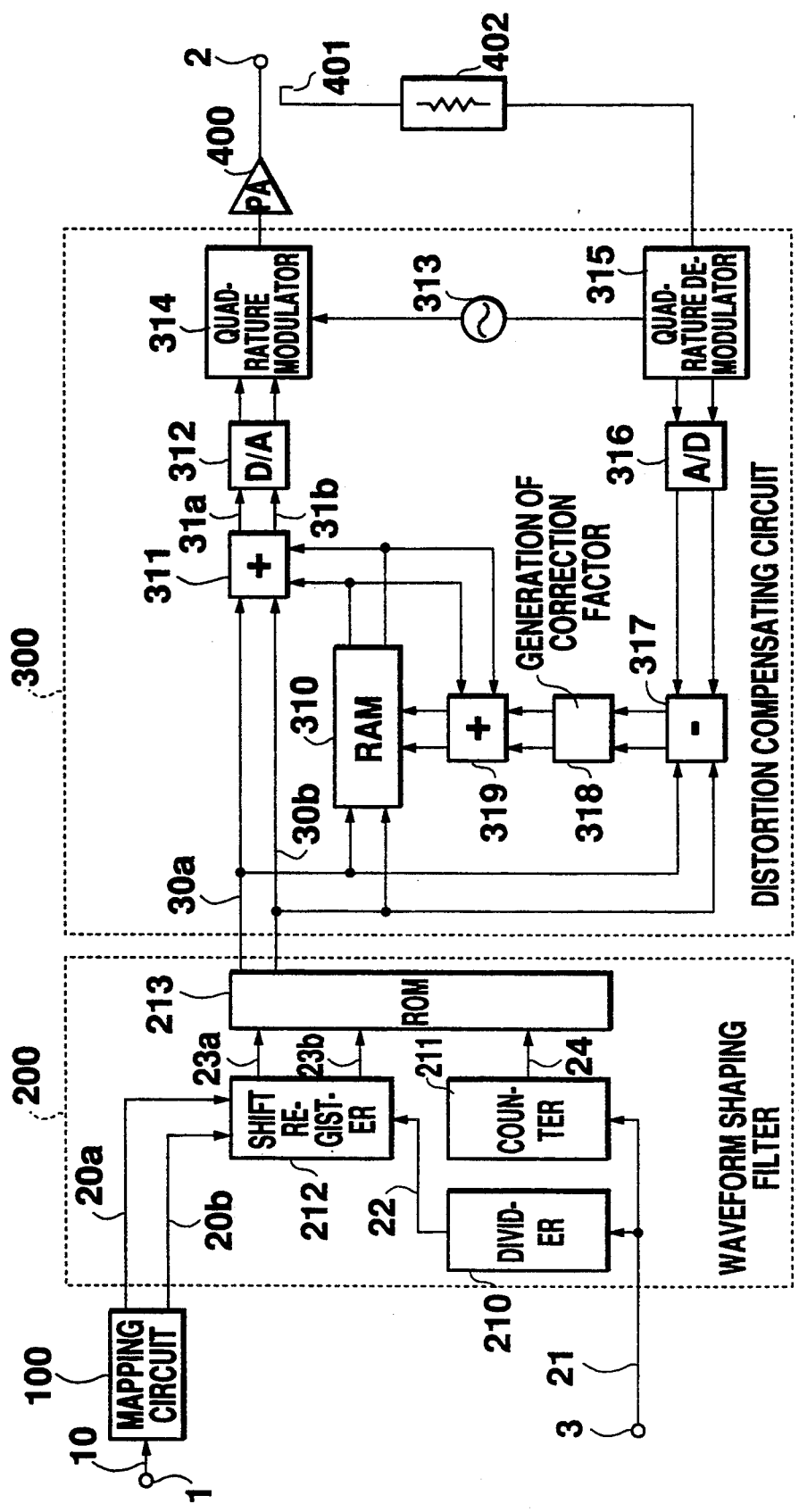
FIG. 3 is a block diagram of a distortion compensating unit constructed in accordance with the prior art.

Referring to FIG. 2, the distortion compensating circuit comprises a temperature sensor 500 functioning as a temperature sensor means for sensing the temperature of the power amplifier 400. If the temperature of the power amplifier 400 is lower than K° C. (K is constant value), the multiplier selecting switches 322a and 322b select the constant $\alpha 1$ side multiplier 320. If the temperature of the power amplifier 400 is equal to or higher than K° C., the multiplier selecting switches 322a and 322b select the constant $\alpha 2$ side multiplier 321. The semiconductor amplifier Generally tends to have its nonlinear distortion easily affected by the temperature of the semiconductor itself. When the multiplier selecting switches are controlled by the temperature of the power amplifier, therefore, the distortion compensating unit can operate more stably with an increased convergence and with a reduced constant.

Better results may be provided by determining the interrelation between the time from the start of operation (system responsibility) and the power amplifier temperature from experiments and further providing an ambient temperature sensor so that the switching of multiplier factors will optimally be performed.

Since the constant of one of the multipliers in the correcting factor generating circuit can be switched to that of the other multiplier in the same circuit according to the present invention, the time required to converge the compensation values into a given value after the distortion compensating unit has been started can be reduced. After such a reduction, the distortion compensating unit can operate with an improved stability.

According to the present invention, the constant of one of the multipliers in the correcting factor generating circuit can be switched to that of the other multiplier in the same circuit, depending on the temperature of the amplifier. As a result, time required to converge the compensation values into a given value after the distortion compensating unit has been started can be reduced under such a condition as including the affection of the temperature in the amplifier. After such a reduction, the distortion compensating unit can operate with an improved stability.

I claim:

1. A distortion compensating unit comprising distortion pre-compensating means having a memory for receiving a base band signal and memory read signal to record and update data used to compensate for the nonlinearity of an amplifier, the distortion pre-compensating means operable to pre-distort the nonlinearity of said amplifier in the opposite direction so that a distortion produced in said amplifier will be offset by said pre-distortion, a modulator responsive to the output of the distortion pre-compensating means to provide a modulated signal to said amplifier, a demodulator for taking out and demodulating part of the output of said amplifier, comparator means for comparing the output of said demodulator with said base band signal, and a correction factor generating circuit for computing a plurality of corrective coefficients to the contents of said memory from the output of said comparator means by switching said corrective coefficients, the corrected contents of said memory being then provided to said base band signal to predistort the nonlinearity of said amplifier.

2. A distortion compensating unit as defined in claim 1 wherein said correction factor generating circuit has a first computing means having a first constant and being operable to perform a computation by the use of said first constant and the output of said comparator means, a second computing means having a second constant and being operable to perform a computation by the use of said second constant and the output of said comparator means, and a plurality of switch means for selecting any one of said first and second computing means.

3. A distortion compensating unit as defined in claim 2 wherein said correction factor generating circuit is operable to switch one of said first and second computing means to the other computing means after passage of a given time from the start of operation of said distortion compensating circuit.

4. A distortion compensating unit as defined in claim 3 wherein the relationship between a constant $\alpha$ in the prior art used to compute the corrected data which is in turn outputted to said distortion pre-compensating means and said first and second constants $\alpha 1$ and $\alpha 2$ is as follows:

$$0 < \alpha 2 < \alpha < \alpha 1 \leq 1$$

and wherein said correction factor generating circuit is operable to compute said corrected data by using said first constant until the given time elapses from the start of said distortion compensating circuit and by using said second constant after passage of said given time.

5. A distortion compensating unit as defined in claim 2 wherein said first and second computing means are multipliers for multiplying said first or second constant by the output of said comparator means to form said corrected data.

6. A distortion compensating unit comprising distortion pre-compensating means having a memory for receiving a base band signal and memory read signal to record and update data used to compensate for the nonlinearity of an amplifier, the distortion pre-compensating means operable to pre-distort the nonlinearity of said amplifier in the opposite direction so that a distortion produced in said amplifier will be offset by said pre-distortion, a modulator responsive to the output of the distortion pre-compensating means to provide a modulated signal to said amplifier, a demodulator for taking out and demodulating part of the output of said amplifier, comparator means for comparing the output of said demodulator with said base band signal, and a correction factor generating circuit for computing a plurality of corrective coefficients to the contents of said memory from the output of said comparator means by switching said corrective coefficients depending on the temperature of said amplifier, the corrected contents of said memory being then provided to said base band signal to pre-distort the nonlinearity of said amplifier.

7. A distortion compensating unit as defined in claim 6, further comprising means for sensing the temperature of said amplifier and wherein said correction factor generating circuit has a first computing means having a first constant and being operable to perform a computation by the use of said first constant and the output of said comparator means, a second computing means having a second constant and being operable to perform a computation by the use of said second constant and the output of said comparator means, and a plurality of switch means responsive to the temperature sensed by said temperature sensing means for selecting any one of said first and second computing means.

8. A distortion compensating unit as defined in claim 7 wherein said first and second computing means are multipliers for multiplying said first or second constant by the output of said comparator means to form said corrected data.

9. A distortion compensating unit as defined in claim 7 wherein the relationship between a constant $\alpha$ in the prior art used to compute the corrected data which is in turn outputted to said distortion pre-compensating means and said first and second constants $\alpha 1$ and $\alpha 2$ is as follows:

$$0 < \alpha 2 < \alpha < \alpha 1 \leq 1$$

and wherein said correction factor generating circuit is operable to compute said corrected data by using said first constant if the temperature sensed by said temperature sensing means is lower than a given level and by using said second constant if said temperature is equal to or higher than said given level.

* * * * *